United States Patent

Field et al.

[15] 3,643,321

[45] Feb. 22, 1972

[54] METHOD AND APPARATUS FOR TAILLESS WIRE BONDING

[72] Inventors: Edwin C. Field, Lansdale; Frederick W. Kulicke, Jr., Philadelphia; Richard W. Masso, Conshohocken, all of Pa.

[73] Assignee: Kulicke and Soffa Industries, Inc., Fort Washington, Pa.

[22] Filed: June 17, 1970

[21] Appl. No.: 46,902

[52] U.S. Cl. ..............................29/470.1, 29/471.1, 29/624, 29/628, 228/3, 228/4

[51] Int. Cl. ..........................................................B23k 21/00

[58] Field of Search ..............29/624, 471.1, 628, 626, 470.1; 228/3, 3.5, 4

[56] References Cited

UNITED STATES PATENTS 3,472,443 10/1969 Holzl et al..................................228/3

3,397,451 8/1968 Avedissian et al......................228/3 X 3,351,103 11/1967 Grainger...................................228/3 X

*Primary Examiner*—Charlie T. Moon

*Assistant Examiner*—R. J. Craig

*Attorney*—John B. Sowell

[57] ABSTRACT

A tailless wire-bonding apparatus for bonding a fine wire to a semiconductor device and breaking the wire behind the bond without disturbing the bond. A wire threaded through a capillary bonding tool is maintained stiff as the wire is being bonded for a final bond. A wire clamp above the bonding tool is actuated to provide the taut piece of wire between the bond and the wire clamp enabling the bonding tool to be moved toward the wire clamp along the taut wire. Subsequently the wire clamp and bonding tool are moved to break the wire at the reduced cross-sectional area of the bonded wire and to expose a predetermined length of wire out of the end of the bonding tool which may be formed under the bonding tool.

18 Claims, 11 Drawing Figures

INVENTORS.
EDWIN C. FIELD
FREDERICK W. KULICKE, JR
BY RICHARD W. MASSO
John B. Sowell
ATTORNEY.

INVENTORS.
EDWIN C. FIELD
FREDERICK W. KULICKE, JR.
BY RICHARD W. MASSO
John B. Sowell
ATTORNEY.

METHOD AND APPARATUS FOR TAILLESS WIRE BONDING

BACKGROUND OF THE INVENTION

The present invention constitutes an improvement in the bonding mechanism of a wire-bonding machine.

In the process of making semiconductor devices, such as integrated circuits, a series of steps called wire bonding is performed to electrically connect terminal points or electrodes by fine wires. In recent years when the last bond was made there was a stub of wire remaining which was referred to as a tail. These tails often proved to be undesirable because they caused shorts between circuits and/or the covers on the semiconductor devices. Removal of the tails by mechanical devices proved to be both costly and unreliable. Several wire-bonding machines have been made which make a final bond and break the wire at the bond eliminating the undesirable stub or tail; these machines are referred to as tailless wire bonders.

Heretofore, tailless wire bonders did not have high reliability and consistent performance. The bond strength was usually low and attempts to break the wire at the bond often pulled the bond loose. When the bonds were made too strong the wire would stretch before it would break, leaving inconsistent length of wire for the next bond. Attempt to weaken or sever the wire behind the bond were made by wiping the wire with the bonding tool after a bond was made of employing cutters. Cutters usually required that the tool be moved and did produce a reliable breaking point in the wire. Sometimes the wire would be cut through before the break was supposed to occur, and the wire would be pulled out of the capillary guide requiring rethreading of the capillary bonding tool.

SUMMARY OF THE INVENTION

The present invention overcomes the limitations of the prior art tailless wire bonders by providing a method and apparatus which will not permit the wire to escape from the bonding tool guide during a bonding and severing operation. The wire is held taut by a wire clamp at the time the final bond is made, then the bonding tool is moved toward the wire clamp so that a predetermined length of wire is exposed from the tip of the tool independent of whether a break occurs in the wire at the bond. The correct length of wire exposed from the tip of the tool is broken at the bond and formed preparatory the next bond before the clamp is released.

A tensioning device is provided so that the wire is lightly urged back into the capillary bonding tool. When manually searching for an electrode or conductive pattern on a semiconductor device the operator often overshoots the target and must return the tool toward the bond. The excess wire played out is returned toward the supply spool automatically without creating an improper loop or kink in the wire.

In the preferred embodiment a special shaped tool is provided for ball bonding. An outer annular tapered face on the tool is employed to bond the wire to an electrode or pattern and to reduce the cross-sectional area at a preferred location on the bond near the center of the working face of the bonding tool.

These and other features, objects and advantages of the invention will be explained in connection with the description of the details of a preferred embodiment construction in reference to the accompanying drawings.

DESCRIPTION OF THE PREFERRED EMBODIMENT

Figures 1, 3:
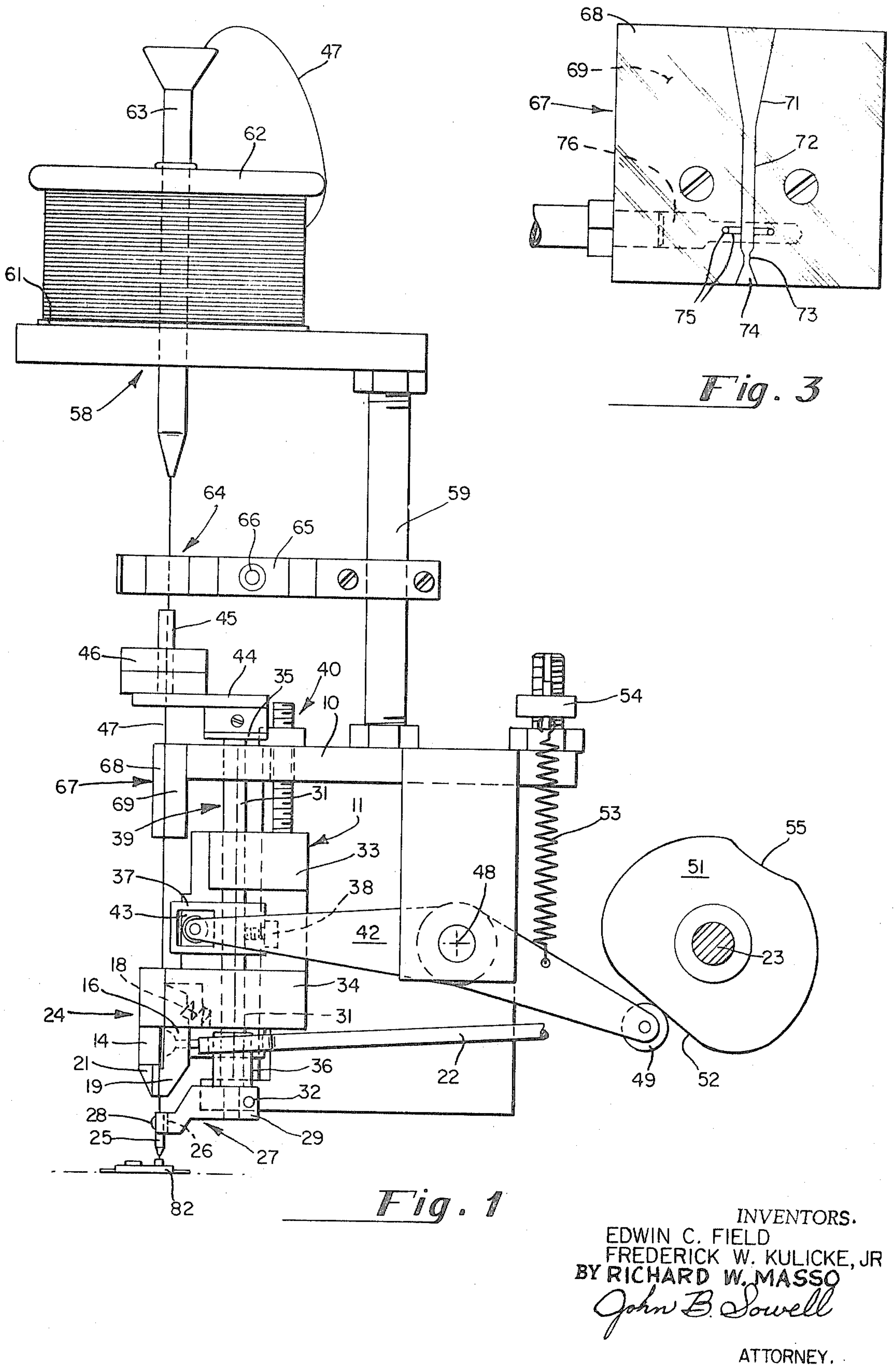
FIG. 1 is a side elevation in section of the wire-bonding apparatus of the present invention.
FIG. 3 is an enlarged front elevation of the tensioning device.
Figure 2:
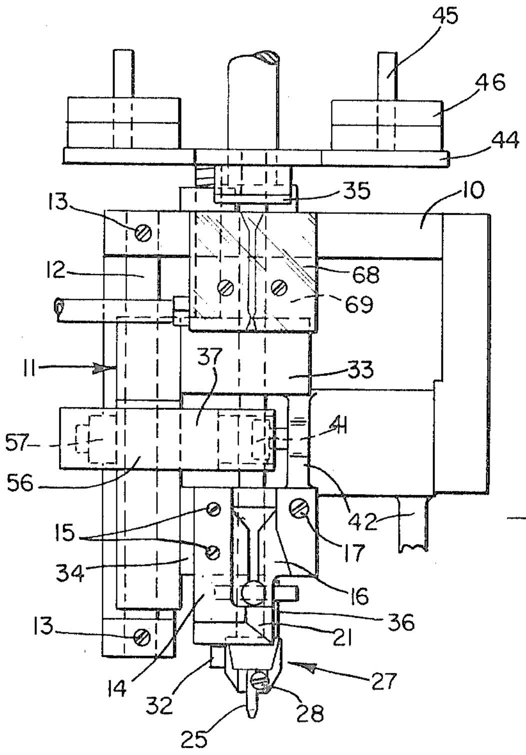
FIG. 2 is a front elevation of wire-bonding apparatus.

FIGS. 1 and 2 of the drawings show a preferred embodiment wire-bonding apparatus comprising a main housing 10 adapted to be fixedly connected to the main frame support of a wire-bonding machine (not shown). A wire clamp support 11 is vertically and slidably mounted on a guide rod 12 affixed to housing 10 by screws 13. An L-shaped fixed wire clamp arm 14 is mounted on wire clamp support 11 by screws 15. A V-shaped movable wire clamp arm 16 pivotally abuts the wire clamp support 11 at the upper end of the V, and is retained in a recess in the clamp support 11 by clamp arm 14 on one side and a plate secured by screw 17 on the other side. Springs 18 urge the lower end 19 of clamp arm 16 into engagement with the lower end 21 of the fixed wire clamp arm 14. Pull rod 22 moves clamp arm 16 to open or close the wire clamp 24 and is actuated by a cam (not shown) driven from the main shaft 23. As will be explained hereinafter rod 22 normally holds the wire clamp 24 open except at the final bond and until the end of the wire is formed under the working face of the bonding tool.

A bonding tool nib 25 is axially aligned below wire clamp 24 and held in a V-slot 26 of a nib holder 27 by a screw 28. The rear of holder 27 forms a split collar 29 which is clamped onto the lower end of support rod 31 by screw 32. Support rod 31 passes through an upper arm 33 and a lower arm 34 of wire clamp support 11 and is vertically guided thereon. The upper end of support rod 31 has an adjustable spacer 35 thereon which engages the top of housing 10 to limit downward travel of the bonding nib 25. A hollow cylindrical spacer 36 on the lower end of rod 31 is adapted to engage the bottom of lower arm 34 of wire clamp support 11 after the bonding nib 25 has been raised a predetermined distance indicative of the desired length of wire to be exposed out of the end of the bonding nib. As will be explained hereinafter the exposed length of wire will be formed under the face of the bonding tool in preparation for starting another series of bonds.

A loose coupling 37 is fixed to support rod 31 by a setscrew 38 and provides the only connection for raising and lowering the tool holder 39 which comprises the parts moved by the coupling 37.

A roller bearing 41 on the end of drive lever 42 loosely fits into a hollow channel-shaped slot 43 of coupling 37. When the bonding tool nib 25 is lowered for a first bond, the bearing 41 remains loose in the slot 43 and the force on the bonding nib at first bond is determined by the weight of the toolholder 39. On the upper end of rod 31 there is connected a weight support frame 44 having two extended pins 45 for accepting weights 46 thereon. The pins 45 are in axial alignment with the bonding nib 25 in FIG. 1, but are laterally disposed from the axis of the bonding nib 25 as viewed in FIG. 2 thus permitting wire 47 direct passage to the bonding nib 25.

Drive lever 42 is pivoted intermediate its ends at pivot point 48 supported from a bracket on the housing 10.

Cam follower 49 is moved by cam 51 (shown exaggerated) on shaft 23. As the cam rises roller bearing 41 on lever 42 engages the top of slot 43 to raise the loose coupling 37. When low portion 52 on cam 51 is opposite follower 49, roller bearing 41 is centered in slot 43 of coupling 37 and only the weight of toolholder 39 is on the bonding nib for a first bond.

Spring 53 is attached to lever 42 and to an adjustable force device 54. When the lower portion 55 on cam 51 is opposite follower 49, roller bearing 41 engages the bottom of slot 43 and the force of spring 53 is applied through lever 42 to the bonding nib 25. This force is in addition to the weight of the tool holder 39 and is required at the second or final bond to mash or partially cut through the wire preparatory to breaking the wire to eliminate the tail.

In a typical operation when employing a 1-mil gold wire for thermocompression bonding, the force at first bond is about 55 grams on the working face of a preferred configuration bonding nib, and the force at the second bond is approximately 100 grams. The forces are selected by experimentation to produce the maximum possible pull strength at both bonds and to facilitate the breaking of the wire at the second bond. The force to be selected for the second bond should be great enough to reduce the cross-sectional area of the wire at least 50 percent. If the second bonding force is properly selected the force employed to pull and break the wire will not diminish the strength of the second or final bond.

An arm 56 on loose coupling device 37 extends outwardly past the edge of housing 10 and is guided on a roller bearing 57 on the housing 10. When the arm 56 is pivoted away from the housing 10, rod 31 and nibholder 27 are also pivoted, so that the bonding nib 25 is out from under wire clamp 24 and easily accessible for loading of the wire 47.

The wire 47 is stored in a wire spool holder 58 which may be mounted on housing 10 or the bonding machine (not shown) by a support shaft 59. The wire 47 on a stationary spool 61 is guided over a highly polished endbell 62 and continues through a highly polished feed tube 63 mounted in axial alignment with the bonding nib 25 and the center of spool 61. This arrangement substantially reduces all frictional forces resisting the feeding of the wire 47 to the bonding nib. Below the outlet of feed tube 63 is a wire damper 64 comprising a pair of shaped metal fingers 65 clamped onto support shaft 59 at one end and provided with pads of friction material such as felt or plastic to engage the wire 47 at the other end. A screw 66 intermediate the ends of fingers 65 provides means for adjusting the damping force.

Below the damper 64 and axially aligned with the wire 47, is a tensioning device 67 comprising a transparent cover 68 and a formed guide plate 69 best shown in FIG. 3. A funnel-shaped passage in plate 69 comprises a tapered feed cone 71, a large diameter passageway 72 which converges into a small-diameter passageway 73 and a tapered exit cone 74. Plate 69 is cross drilled at aperture 75 to connect the large-diameter passageway 72 at a point near the transition into the small-diameter passageway 73 to a compressed air supply inlet 76. The major portion of air entering the large-diameter passageway 72 flows upwardly and out feed cone 71 to produce a gentle upward pull on the wire 47. The airflow through the small passageway 73 tends to offer a frictionless guide for the wire.

Figure 4:
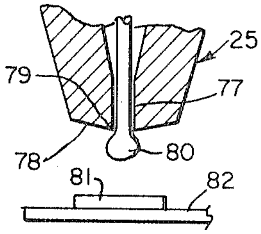
FIG. 4 is an enlarged partial section in elevation of the tip of the bonding nib preparatory to first bond.
Figure 5:
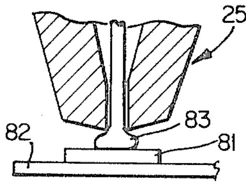
FIG. 5 is a partial section in elevation of the bonding nib at first bond.

In order to better explain a preferred mode of operation of the above-described apparatus, reference is made to FIGS. 4 to 10 showing the tip of a preferred configuration bonding nib 25 in sectional elevation. FIG. 4 shows bonding nib 25 having an orifice 77 through the working face 78 of the bonding nib 25. The working face 78 of bonding nib 25 is annular and tapers at about 15° from the horizontal. Face 78 of bonding nib 25 joins the orifice 77 at a small radius 79 so that ball 80 cannot enter the orifice. When an operator starts a bonding operation the bonding nib 25 is in a raised position as shown in FIG. 4 and the wire clamp 24 is very close to the top of the the bonding nib 25. Nib 25 is then lowered, as shown in FIG. 5 to engage ball 80 with a point 81 on semiconductor 82 and make the first thermocompression bond 83. When bonding nib 25 was lowered it moved away from the wire clamp 24 which was held in place by screw support 40 which engaged housing 10 at the lower end of the screw. The force on the bonding nib 25 was supplied by the free weight of tool holder 39 as roller bearing 41 on drive lever 42 was disengaged from loose coupling 37.

Figure 6:
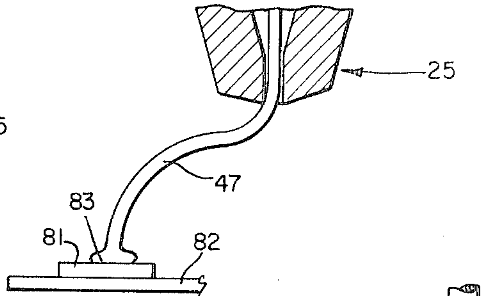
FIG. 6 is a partial section in elevation of the bonding nib preparatory to second bond.

After the first bond 83 the bonding nib 25 is raised, playing out wire 47 as shown in FIG. 6. Since the wire clamp is being held open during this and previously described operations, tensioning device 67 is effective to maintain a minimum amount of wire 47 between the tip of the bond nib 25 and bond 83 even though the operator may reverse the direction of relative movement between bonding nib 25 and the first bond 83.

Figure 7:
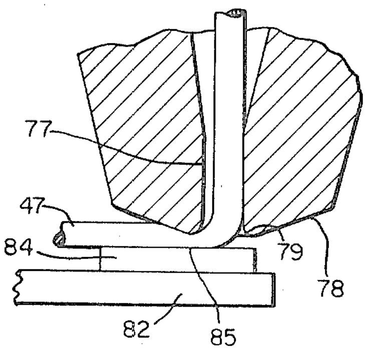
FIG. 7 is an enlarged partial section in elevation of the bonding nib at second bond.

The bonding nib 25 is again lowered as shown in FIG. 7 to engage the wire 47 with another point 84 on the semiconductor 82. Cam 51 advances lower portion 55 opposite roller 49 enabling spring 53 to move lever 42 so that roller bearing 41 engages the bottom of loose coupling 37. The extra force applied by spring 53 is sufficient to mash the wire at the radius 79, reducing the cross-sectional area and making a second thermocompression bond 85 under the working face 78.

Figure 8:
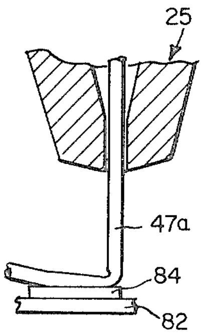
FIG. 8 is a partial section in elevation of the bonding nib after second bond and preparatory to breaking the wire.
Figure 9:
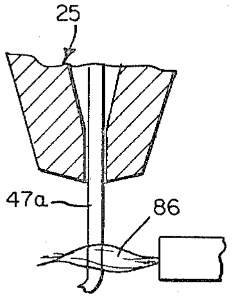
FIG. 9 is a partial section in elevation of the bonding nib after the wire is broken and before being formed.
Figure 10:
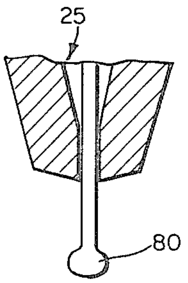
FIG. 10 is a partial section in elevation of the bonding nib after a ball is formed.

The wire clamp 24 is preferably closed while the second bond 85 is being made and at least before the bonding nib 25 is raised. By closing the wire clamp 24 while bonding nib 25 is separated from the wire clamp 24 a taut piece of wire 47 is provided between the wire clamp 24 and the bond 85. When the cross-sectional area of the wire is so reduced as to be ready to break, the taut section of the wire is relatively stiff. When the bonding nib 25 is raised toward the now stationary closed wire clamp 24 the wire 47 is effectively pushed out of the end of the bonding nib 25. As nib 25, nibholder 27, support rod 31 and spacer 36 are raised further, spacer 36 engages wire clamp support 11 and raises the now-closed wire clamp 24, causing the wire 47 to break at the bond 85 and leave a predetermined length of wire 47*a* exposed out of the end of the bonding nib 25 as shown in FIGS. 8 and 9. The exposed wire 47*a* is melted by a hydrogen flame 86 to form a ball 80 about 2 to 2½ times the wire diameter. The size of the ball depends on several factors one of which is the critical length of wire 47*a* in the flame path. Since the wire clamp 24 is very close to the short bonding nib 25, the length of wire being pulled is very short. Since the cross-sectional area of wire 47 is substantially reduced before the wire is pulled, the wire is broken with negligible elongation of the short taut piece of wire 47*a*. Had the wire 47*a* not been short and the bonding nib 25 moved toward the wire clamp 24 along the stiff or taut piece of wire 47*a*, it would be possible for the wire 47 to bend or break or even snap back into the orifice 77 of the bonding nib 25 so as to create a malfunction. In prior art devices it was common to raise the wire clamp and the bonding tool together and close the wire clamp 24 during the upward motion of the clamp 24. It should be apparent that the breaking force of such devices could occur at various elevations depending on the clamping force and the strength of the bond 85. It was impossible to cut nearly through the wire 47 and maintain any tensioning force with such devices because the wire could easily be pulled back through the bonding nib 25.

After making the ball 80 on the end of wire 47 the wire clamp 24 is opened and the tensioning device 67 pulls the ball 80 up into engagement with the working face 78 of the bonding nib 25 as shown in FIG. 4.

Figure 11:
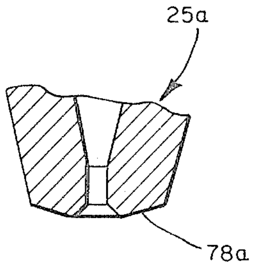
FIG. 11 is a partial section in elevation of modified bonding tool.

FIG. 11 illustrates another configuration bonding nib 25*a* preferably used for ultrasonic bonding of wires. The wire 47 for the first bond is formed or folded under the working face 78*a* of the bonding nib 25*a* similar to that shown in FIG. 5 and is bonded with a lighter pressure than the second bond. The second bond is made the same as described with regard to FIG. 7 employing ultrasonic energy on the bonding nib 25*a*. The above-described motion of the bonding nib 25 and wire clamp 24 are then employed to break the wire. The exposed end of the wire is formed under the working face of the bonding tool in preparation for further bonding operations.

It is apparent from the above description that a plurality of bonds may be made on a continuous wire to stitch or bond to several points before increasing the bonding force to make a final or last bond, where the cross-sectional area of the wire is substantially reduced.

Having explained in detail the operation, features, and advantages of a preferred embodiment structure, it should be understood that operations are performed in a manner which permits exact and precise rapid movements of a wire-bonding nib. The manner in which the operations are sequentially performed permits more rapid bonding with a higher degree of reliability than was heretofore attained.

We claim:

1. Apparatus for bonding fine wires to a semiconductor device and making tailless wire bonds comprising:
  - a housing adapted to be fixedly mounted on a bonding machine,
  - a toolholder slidably mounted in the housing and adapted to support a wire-bonding nib,
  - a wire clamp slidably mounted on said housing for movement relative to said wire-bonding nib,
  - toolholder drive means for lowering said tool support to engage the working face of the bonding nib with a fine wire extending under the working face of the bonding nib,
  - means supplying a predetermined force on the bonding nib for bonding the wire to a point on a semiconductor device and for reducing the cross-sectional area of the wire,
  - means for closing the wire clamp while the bonding nib engages the wire at the bond to provide a stiff piece of wire between the bond and the wire clamp, and
  - said toolholder drive means including means for raising the toolholder and the bonding nib along the stiff wire toward the wire clamp and subsequently raising the bonding nib and the wire clamp together to break the wire at the reduced cross-sectional area leaving a tailless wire bond connection.

2. Apparatus as set forth in claim 1 wherein said wire clamp is mounted on a movable wire clamp support slidably mounted on said housing.

3. Apparatus as set forth in claim 2 wherein said tool support is slidably guided in said wire clamp support.

4. Apparatus as set forth in claim 1 wherein said tool support is both moved and supported by said toolholder drive means acting through a loose coupling member affixed to said tool support.

5. Apparatus as set forth in claim 4 wherein said toolholder drive means is disengaged from said loose coupling during a first bond and is engaged with said loose coupling during a second bond, said toolholder drive means comprising means supplying a predetermined force on the bonding nib for bonding the wire and reducing the cross-sectional area of the wire.

6. Apparatus as set forth in claim 5 wherein said toolholder drive means comprises a cam actuator and a pivoted drive lever, one end of said lever being engaged in said loose coupling and the other end having a cam follower normally engaging said cam actuator for raising and lowering said toolholder.

7. Apparatus as set forth in claim 5 wherein said cam actuator has a low portion for normally disengaging said pivot lever follower during a second bond, and spring means connected to said drive lever urging said lever into engagement with said loose coupling for applying a downward force on the bonding nib.

8. Apparatus as set forth in claim 1 which further includes a wire-tensioning device directly above said wire clamp.

9. Apparatus as set forth in claim 2 wherein said tensioning device comprises a plate having a first small orifice connected to a second larger orifice through which the wire is passed, and a compressed air source connected to the large orifice adjacent the small orifice to provide a light tension in the wire urging the wire away from the bonding nib and toward tensioning device.

10. Apparatus as set forth in claim 9 which further includes a holder for a wire spool axially mounted above said tensioning device.

11. Apparatus as set forth in claim 10 wherein said holder includes a highly polished feed tube mounted through the center axis of the wire spool.

12. Apparatus as set forth in claim 10 wherein said wire spool holder includes a highly polished endbell fitted on the wire spool.

13. Apparatus as set forth in claim 10 which further includes a wire damper mounted intermediate said spoolholder and said tensioning device.

14. A method of wire bonding to connect points on a semiconductor device characterized by the steps of:
  - making a first wire bond to a point on a semiconductor device in a conventional manner,
  - raising the bonding nib up and away from the first bond to play out wire through the bonding nib,
  - lowering the bonding nib to engage the wire with a second point on a semiconductor device,
  - mashing the wire with the bonding nib to make a second bond on the semiconductor device and to reduce the cross-sectional area of the wire at the second bond,
  - clamping the wire with a wire clamp directly above the bonding nib to provide a short stiff wire between the clamp and the bond,
  - raising the bonding nib a predetermined distance toward the wire clamp to provide a predetermined length of wire between the tip of the bonding nib and the bond,
  - raising the wire clamp and the bonding nib together to cause the wire to break at the reduced cross-sectional area and to leave said predetermined length of wire exposed out of the tip of the bonding nib, and
  - forming the exposed length of wire under the tip of the bonding nib.

15. A method as set forth in claim 14 wherein said wire clamp is released after the wire is formed under the tip of the bonding nib.

16. A method as set forth in claim 15 wherein the wire exposed out of the tip of the bonding nib is urged into the bonding nib when the wire clamp is released.

17. A method as set forth in claim 15 wherein said exposed length of wire under the tip of the bonding tool is melted to form a ball thereon, and the ball is urged into engagement with the bonding nib.

18. A method as set forth in claim 14 wherein said cross-sectional area of said wire is reduced by at least 50 percent when said wire is mashed at the second bond.

* * * * *